(12) United States Patent
Kurimura et al.

(10) Patent No.: US 7,413,430 B2
(45) Date of Patent: Aug. 19, 2008

(54) CRYSTAL BASE PLATE AND PRESSING DEVICE

(75) Inventors: Sunao Kurimura, Tsukuba (JP); Masaki Harada, Tokyo (JP)

(73) Assignee: National Institute for Materials Science, Tsukuba-shi, Ibaraki (JP)

( * ) Notice: Subject to any disclaimer, the term of this patent is extended or adjusted under 35 U.S.C. 154(b) by 345 days.

(21) Appl. No.: 10/523,168

(22) PCT Filed: Sep. 18, 2003

(86) PCT No.: PCT/JP03/11882

§ 371 (c)(1), (2), (4) Date: Jan. 27, 2005

(87) PCT Pub. No.: WO2004/027125

PCT Pub. Date: Apr. 1, 2004

(65) Prior Publication Data

US 2005/0225215 A1 Oct. 13, 2005

(30) Foreign Application Priority Data

Sep. 20, 2002 (JP) ............................. 2002-276001

(51) Int. Cl.
- *A01J 21/00* (2006.01)
- *B29B 15/00* (2006.01)
- *G02F 2/02* (2006.01)
- *C30B 29/18* (2006.01)

(52) U.S. Cl. .................. 425/405.1; 425/384; 425/394; 100/258 R; 359/328; 359/332; 385/3; 385/122; 385/129; 117/930; 117/943

(58) Field of Classification Search .............. 425/384, 425/405.1, 394; 100/258 R; 359/328, 332; 385/3, 122, 129; 117/930, 943
See application file for complete search history.

(56) References Cited

U.S. PATENT DOCUMENTS 3,987,377 A * 10/1976 Kuroda et al. ............... 333/151

(Continued)

FOREIGN PATENT DOCUMENTS

EP 1168464 A1 1/2002

(Continued)

OTHER PUBLICATIONS

Nao Kurimura et al, "Suichoku Ouryoku Inka ni yoru Suisho no Twin Seigyo", Dai 61 Kai Extended abstracts; the Japan Society of Applied Physics, No. 3, p. 1016, 3a-Q-1 (Sep. 3, 2000).

*Primary Examiner*—Robert Kunemund
*Assistant Examiner*—G. Nagesh Rao
(74) *Attorney, Agent, or Firm*—Frishauf, Holtz, Goodman & Chick, P.C.

(57) ABSTRACT

The upper block 12 contacts the bearing block 20, and the bearing block 20 is coupled to the upper plate 21. The upper block 12 has a protruding part 22 on the upper surface that is worked into a convex surface with a radius of R1, and the bearing block 20 has a recessed part 23 in the undersurface that is worked into a concave surface with a radius of R2 (R2>R1). As a result of such a construction being used, the pressing surface of the upper pressing plate 15 always conforms to the surface of the quartz crystal substrate 11 during pressing, so that a uniform load is applied to the quartz crystal substrate 11. As a result, the surface of the quartz crystal can be uniformly pressed in the hot pressing method.

3 Claims, 5 Drawing Sheets

U.S. PATENT DOCUMENTS

| | | | | |
|---|---|---|---|---|
| 4,435,441 | A * | 3/1984 | Mariani et al. | 427/10 |
| 6,029,500 | A * | 2/2000 | Tom | 73/31.05 |
| 6,031,315 | A * | 2/2000 | Abbott | 310/313 A |
| 6,099,771 | A * | 8/2000 | Hudkins et al. | 264/102 |
| 6,452,306 | B1 * | 9/2002 | Inoue et al. | 310/313 A |
| 6,471,501 | B1 * | 10/2002 | Shinma et al. | 425/127 |
| 6,627,137 | B2 * | 9/2003 | Saito et al. | 264/275 |
| 6,696,220 | B2 * | 2/2004 | Bailey et al. | 425/385 |
| 6,857,865 | B2 * | 2/2005 | Tsai et al. | 425/116 |
| 7,177,070 | B2 * | 2/2007 | Kurimura et al. | 359/326 |
| 2001/0025001 | A1 * | 9/2001 | Oda et al. | 501/32 |
| 2005/0019439 | A1 * | 1/2005 | Matsuki et al. | 425/4 R |

FOREIGN PATENT DOCUMENTS

JP  9-83281 A  3/1997

* cited by examiner

CRYSTAL BASE PLATE AND PRESSING DEVICE

This application is the United States national phase application of International Application PCT/JP2003/011882 filed Sep. 18, 2003.

TECHNICAL FIELD

The present invention relates to a quartz crystal substrate which is used to form a twin in a quartz crystal by a hot pressing method, and a pressing apparatus which is used to form a twin in a quartz crystal by a hot pressing method, and which is suitable for manufacturing the quartz crystal substrate described above.

BACKGROUND ART

A quasi-phase matched wavelength conversion optical element has been proposed in which a periodic polarization inversion structure is realized by applying a stress to quartz crystal ($SiO_2$), which is a paraelectric material, in the vicinity of the α-β phase transition temperature, so that a periodic twin structure is created (S. Kurimura, R. Batchko, J. Mansell, R. Route, M. Fejer and R. Byer: 1998 Spring Meeting of the Japan Society of Applied Physics Proceedings 28a-SG-18). This is a method in which a quasi-phase matched crystal based on quartz is manufactured by utilizing the twin crystal of quartz to achieve a periodic inversion of the sign of the nonlinear optical constant $d_{11}$, and this quasi-phase matched crystal is used as the quasi-phase matched wavelength conversion optical element.

In the case of quartz, the short absorption edge is a wavelength of approximately 150 nm, and ultraviolet absorption at wavelengths shorter than 200 nm is almost negligible compared to the case of nonlinear optical elements using conventional birefringence phase matching (β-$BaB_2O_4$ and $CsLiB_6O_{10}$, etc.) or nonlinear optical elements using the quasi-phase matching of ferroelectric materials ($LiNbO_3$ and $LiTaO_3$, etc.). Furthermore, this also has the following special feature not seen in conventional nonlinear optical elements: namely, there is a possibility of generating, with a high efficiency, light with a wavelength of approximately 193 nm, which is comparable to the light of an ArF excimer laser, by second harmonic generation. By setting the period at several microns to several tens of microns, it is possible to use the twin structure as a practical wavelength conversion device. A semiconductor exposure apparatus using this quasi-phase matched quartz crystal has been proposed (Japanese Patent Application Kokai No. H2002-122898.

Initially, a method in which a periodic Cr film is formed on the surface of a quartz crystal substrate using lithographic and thin film formation techniques, and the temperature is elevated to around 550° C., so that thermally-induced stress is applied utilizing the in-plane stress arising from the difference in linear thermal expansion coefficient between the quartz crystal and Cr, was proposed as a method for manufacturing a periodic twin structure in a quartz crystal (S. Kurimura, R. Batchko, J. Mansell, R. Route, M. Fejer and R. Byer: 1998 Spring Meeting of the Japan Society of Applied Physics Proceedings 28a-SG-18). In this method, the crystal axes are inverted only in the portion where the Cr film is formed, so that a periodic twin structure is produced.

In this method, however, since a stress component that is parallel to the plane of the quartz crystal substrate is used, stress is localized in the vicinity of the surface of the crystal, so that a portion with inverted crystal axes is formed only to a depth of a few microns from the surface of the crystal. Consequently, since a periodic twin structure which extends into the interior portions, i.e., a periodic twin structure with a large aspect ratio, is not obtained, the realization of a bulk optical element that can be used for the wavelength conversion of laser light is impossible.

The hot pressing method has been proposed as the method for solving such problems (S. Kurimura, I. Shoji, T. Taira, M. Fejer, Y. Uesu and H. Nakajima: 2000 Fall Meeting of the Japan Society of Applied Physics Proceedings 3a-Q-1) In this method, a periodic step structure is formed on the surface of one side of a quartz crystal substrate, this quartz crystal substrate is clamped between heater blocks from above and below, the temperature of the quartz crystal substrate is elevated, and pressure is applied at the point in time at which this temperature reaches a desired temperature. In this case, since stress acts only on the portions corresponding to the protruding parts of the step structure, the crystal axis is inverted only in these portions. These portions with inverted crystal axes grow to the interior of the crystal and are thus propagated into the crystal, so that a periodic twin lattice that penetrates greatly in the direction of depth can be manufactured. Specifically, stress is concentrated only in the protruding portions, and twins are generated from these areas; these twins gradually grow into the interior, so that a twin structure with a large aspect ratio is manufactured.

An example of such a quartz crystal substrate in which a step structure is formed on the surface of one side will be described with reference to FIG. 4. A step structure is formed on the surface of one side of a quartz crystal substrate 1; as a result, protruding parts 2 that have a solid rectangular shape are formed at a specified interval. These protruding parts 2 have a specified width in the left-right direction in the figure, and the plurality of protruding parts 2 are formed at a spacing that is the same as this width in the left-right direction in the figure. The protruding parts 2 have a rectangular solid shape that is long in the direction of depth in the figure. The direction parallel to this longitudinal direction is taken as the direction of the a axis. Naturally, the a axis is perpendicular to the normal of the quartz crystal substrate 1.

The direction of the c axis of the quartz crystal is perpendicular to the a axis; however, this c axis is slightly inclined with respect to the normal direction of the quartz crystal substrate 1, as described by S. Kurimura in the May 2000 issue of the Journal of the Japan Society of Applied Physics. Specifically, the quartz crystal substrate 1 is cut so that the normal and the c axis form a slight angle. The reason for this is that the component of an elastic compliance tensor $s_{1123}$ is used in a procedure in which a periodic twin structure is manufactured by the stress application of the inter-twin energy difference. Twins tend to be generated as this angle increases; in actuality, however, this angle is kept to an angle of approximately 10 to 20 degrees.

As is shown in the figure, the light is incident from the end surface of the quartz crystal substrate 1, and the direction of polarization is the same direction as the direction of the a axis. The light whose wavelength is converted inside the quartz crystal substrate 1 is emitted from the end surface that is located on the opposite end from the incident surface.

An example of the method for manufacturing the protruding parts 2 shown in FIG. 4 will be described below. First, a Cr film is formed to a thickness of approximately 100 nm on the surface of the quartz crystal substrate 1 by a sputtering method. The surface of this film is coated with a positive type resist, and the portions other than the portions that will form the protruding parts 2 are exposed and developed using a semiconductor exposure apparatus such as an i-line stepper.

Next, the Cr film is fused and removed using the remaining resist as a mask. Then, wet etching is performed by means of hydrofluoric acid using the remaining resist film and Cr film as a mask, so that a step structure with a depth of about a few microns is manufactured. As a result, a quartz crystal substrate 1 is completed which has a step structure with protruding parts 2 such as those shown in FIG. 4 formed on the surface. Furthermore, the Cr film may either be stripped or not stripped prior to pressing.

It is convenient in a wavelength conversion device that the angle between the c axis and the normal of the quartz crystal substrate be as small as possible; however, the stress required for twin formation is increased in this case. Accordingly, as was described above, the quartz crystal substrate is cut so that the angle between the c axis and the normal of the quartz crystal substrate is an angle ranging from a few degrees to approximately 20 degrees.

FIG. 5 shows a schematic diagram of an example of a pressing apparatus that applies temperature and pressure to such a quartz crystal substrate. This is basically a pressing apparatus comprising four supporting columns 41, an upper block 42 and a lower block 43. The upper block 42 is attached to an upper plate 44, and the upper plate 44 is fastened in place by being clamped by nuts from both sides of the supporting columns 41. The lower block 43 is attached to a lower plate 45, and the lower plate 45 is mounted on a hydraulic cylinder 46. The lower plate 45 and lower block 43 are caused to move upward and downward by the raising and lowering of the piston of the hydraulic cylinder 46, so that a pressing force is generated. A load gauge 47 is disposed between the hydraulic cylinder 46 and lower plate 45, so that the value of the applied load can be monitored.

Respective heaters 48 are attached to the upper block 42 and lower block 43, and are covered by an adiabatic plate (e.g., Hemisul (trademark)) except for the pressing surfaces. The upper block 42 and lower block 43 are respectively made of SUS304, and the pressing surfaces of these blocks are precisely polished to a flatness of approximately 3 µm. Holes are formed in the upper block 42 and lower block 43 from the side surfaces, and the heaters 48 are inserted into these holes. Furthermore, thermocouples (not shown in the figure) used for temperature control are inserted into the side surfaces of the upper block 42 and lower block 43, and these thermocouples are connected to a temperature adjustment device (not shown in the figure). This temperature adjustment device is constructed so as to operate the current that flows through the coils of the heaters 48 by PID control; as a result, the pressing surfaces of the upper block 42 and lower block 43 can be elevated to a desired temperature.

A combination of air pressure and hydraulic pressure is used to control the pressing load. Air at a pressure of several hundred MPa is supplied to an electrical air regulator 49 which can control the flow rate by means of voltage. A voltage from a function generator 50 that can generate arbitrary voltage patterns with respect to time is supplied to the electrical air regulator 49.

The air that is generated by this electrical air regulator 49 is supplied to a hydraulic pressure conversion amplifier 51. This hydraulic pressure conversion amplifier 51 has a 36-fold pressure amplification function. The hydraulic pressure of the hydraulic pressure conversion amplifier 51 is converted into a load by being supplied to the hydraulic cylinder 46, so that a maximum pressing load of approximately 10 kN can be obtained.

A quartz crystal substrate 52 of the type shown in FIG. 4 is placed on top of the lower block 43. In a state in which the lower plate 45 and lower block 43 are raised so that the quartz crystal substrate 52 is clamped by the upper block 42 and lower block 43, the temperature is elevated to the vicinity of the twin transition temperature of the quartz crystal; then, when the desired temperature has been reached, a stress is generated in the surface of the quartz crystal by applying the pressing load described above to the surface of the quartz crystal substrate 52. A desired stress waveform can be obtained in the tracking ranges of the air pressure and hydraulic systems described above by varying the voltage pattern that is generated by the voltage generating device 50.

The quartz crystal substrate 52 has the structure described above, and has a size ranging from several millimeters to several tens of millimeters. Furthermore, after twins are generated at one time by using a wafer with a diameter of several inches or so, these twins can also be cut into smaller segments. The thickness of the quartz crystal substrate 52 is set at approximately 0.1 millimeters to several millimeters so that utilization as a bulk optical element is possible.

Both surfaces of the quartz crystal substrate 52 are polished with high precision, thus ensuring the degree of parallel orientation of both surfaces of the substrate and the surface precision of the respective surfaces so that the mean wave aberration is approximately $0.03\lambda$ ($\lambda=0.638$ µm) or less. In the case of quartz crystal, this corresponds to a surface precision of approximately 0.045 µm, which is sufficiently fine compared to the steps formed in the quartz crystal surface described above.

Conventionally, as was described above, wet etching by means of hydrofluoric acid has been used as a method of forming steps in quartz crystal. However, in the case of wet etching using hydrofluoric acid, the side surfaces are also removed in addition to etching in the direction of depth; accordingly, especially in cases where a twin structure with a short period is formed, steps are not formed with the same period as the mask. Furthermore, since etching proceeds to a greater extent in the direction oriented along the c axis, the following problem also arises: namely, the depth that is removed varies according to the angle of the c axis with respect to the normal of the quartz crystal substrate.

Furthermore, in the case of a pressing apparatus such as that shown in FIG. 5, the upper pressing surface and lower pressing surface must be parallel in order to apply stress in a uniform manner to the quartz crystal substrate in which both surfaces are being planarized more or less parallel to each other. Moreover, the surface flatness of the respective pressing surfaces must be sufficiently fine compared to the step depth (about a few microns) on the surface of the quartz crystal substrate.

In the case of the conventional pressing apparatus shown in FIG. 5, the lower plate 5 to which the lower block 43 is attached slides along the supporting columns 41, so that the pressing surface of the lower block 43 cannot be adjusted. Accordingly, in order to adjust the degree of parallel orientation of the upper pressing surface and lower pressing surface, it is necessary to move the upper plate 44 to which the upper block 42 is attached. The upper plate 44 is fastened to the four supporting columns 41 (in which screw threads are cut) by being clamped by nuts. An adjustment is performed by turning these nuts so that the pressing surface of the upper block 42 and the pressing surface of the lower block 43 are oriented parallel to each other.

However, adjustment so that the pressing surface of the upper block 42 and the pressing surface of the lower block 43 maintain a degree of parallel orientation of a few microns is extremely difficult, since actual screws have play and backlash. Furthermore, even assuming that such an adjustment is favorably accomplished, the following problem is encountered: namely, loosening of the screws, etc., in repeated pressing makes it impossible to maintain the degree of parallel orientation, so that re-adjustment must be performed for each operation. For such reasons, the distribution of the load that is applied to the surface of the quartz crystal substrate becomes non-uniform, and this makes it difficult to manufacture a periodic twin structure in a uniform manner.

Furthermore, the surface flatness of conventionally used pressing surfaces is approximately 3 μm, which is more or less the same as the depth of the step working in the surface of the quartz crystal; accordingly, it is difficult to say that the load is uniformly applied.

Moreover, conventionally used pressing surfaces are formed from SUS304; this material tends to soften at high temperatures, and is therefore unsuitable for use in the formation of twins by applying a stress to the surface of the quartz crystal substrate. Furthermore, other problems such as the following problem also occur: namely, traces corresponding to the protruding parts of the step working of the quartz crystal remain in the pressing surfaces after pressing, so that the surface flatness deteriorates. Thus, in conventional pressing apparatuses, there are problems not only in terms of the degree of parallel orientation of the pressing surfaces, but also in terms of the surface flatness and material of the pressing surfaces.

Problems have also been encountered in the pressure control method used in conventional pressing apparatuses. First of all, in the case of control by hydraulic pressure using a hydraulic pressure conversion amplifier, the drawback of a slow response speed is a problem. Specifically, the response time of air pressure is a maximum of 100 ms or less; however, since the rise time of a hydraulic pressure conversion amplifier is long, a time of approximately 1 second is required for the transition from a state in which the load is 0 kN to the maximum load of 10 kN. Furthermore, there is a dead time of 100 ms or longer from the input of the voltage signal to the response of the hydraulic pressure.

Furthermore, in the case of control by hydraulic pressure, the problem of a narrow load setting range arises. In the hydraulic pressure conversion amplifier described above, in cases where a very small air pressure is applied, there is a failure to respond because of the viscosity of the oil. Accordingly, in a system with a maximum load of 10 kN, it is difficult to generate a load of approximately 2 kN or less. Consequently, in cases where the optimal load for twin formation is 2 kN or less, the hydraulic pressure conversion amplifier must be replaced. In such cases, all of the oil in the hydraulic system must be removed and replaced, so that an extremely large amount of work is required; moreover, specialized expertise is required. Furthermore, when the oil is injected following replacement of the hydraulic cylinder, care must be taken to ensure that no air is admixed with the oil, so that considerable time is required. For such reasons, it is extremely difficult to find optimal load conditions for the manufacture of a periodic twin structure in the case of conventional pressing apparatuses.

Furthermore, in a conventional pressing apparatus, as is shown in FIG. 5, both the upper block 42 and lower block 43 each use only one heater 48; consequently, the distance between the heater and the pressing surface varies according to the location on the pressing surface. As a result, a temperature variation with a maximum value of several tens of degrees Celsius is generated in the pressing surfaces, so that the following problem arises: namely, a temperature distribution is produced in the quartz crystal substrate as well, and even if a stress is uniformly applied, there is some irregularity in the manner in which the twin is formed.

Furthermore, in cases where a twin is formed in a quartz crystal using a conventional hot pressing method, the following problem arises: namely, as was described above, the work of forming a step structure on one side of the quartz crystal substrate using photolithographic and wet etching methods must be performed for each quartz crystal substrate.

The present invention was devised in light of the above circumstances; it is an object of the present invention to provide a quartz crystal substrate and a pressing apparatus that make it possible to solve the various problems described above.

DISCLOSURE OF THE INVENTION

The first invention that is used to achieve the object described above is a quartz crystal substrate used to form a twin in a quartz crystal by the hot pressing method, this quartz crystal substrate being characterized in that this substrate has, on one side, a step structure in which protruding parts that serve as pressure receiving surfaces for receiving the pressure of the pressing apparatus are formed, and this step structure is formed by a combination of a lithographic exposure technique and dry etching.

In this invention, dry etching is used in order to solve the problems that are caused by wet etching as described above. Steps of a few microns can easily be obtained by using lithographic exposure and dry etching, e.g., reactive ion etching (abbreviated to "RIE"). A step structure with a minimum period of approximately 2 μm can easily be manufactured by using an i-line stepper, etc., for exposure. Furthermore, it has been found through electron-microscopic observation that a structure in which the side surfaces of the steps are relatively smooth can be obtained, and that a structure with a vertical slope that is close to 90° can be obtained regardless of the anisotropy of the crystal.

Furthermore, in the case of this method, since the rate at which the side surfaces of the steps are removed is small (unlike wet etching), a periodic structure reflecting the period of the mask can be obtained. Dry etching methods that can be used are not limited to RIE; other methods such as induced coupled plasma (abbreviated to "ICP") or the like can also be used.

The second invention that is used to achieve the object described above is a pressing apparatus used to form a twin in a quartz crystal by the hot pressing method, this pressing apparatus being characterized in that one of the pressing surfaces is held on the, main body of the pressing apparatus via a swinging mechanism.

In this invention, one of the two pressing surfaces is held on the main body of the pressing apparatus via a swinging mechanism. The term "swinging mechanism" refers to a mechanism which makes it possible to vary the angle formed by the center axis of the main body of the pressing apparatus and the center axis of the pressing surface; for example, such mechanisms include free shank mechanisms, spherical bearing mechanisms, gimbal mechanisms, and the like.

If this is done, the pressing surface that is held on the main body of the pressing apparatus via the swinging mechanism is adjusted by the swinging mechanism so that this pressing surface is parallel to the other pressing surface during pressing; accordingly, the load that is applied to the pressed surfaces of the quartz crystal substrate can be made uniform regardless of the position on the quartz crystal substrate that is being pressed. Consequently, there is no need to adjust the degree of parallel orientation of the pressing surfaces.

The third invention that is used to achieve the object described above is a pressing apparatus used to form a twin in a quartz crystal by the hot pressing method, this pressing apparatus being characterized in that the apparatus has heater blocks, and pressing members that are constructed from a different material from the material of these heater blocks are attached to these heater blocks.

In this invention, heat transfer is improved by forming the heater blocks that are heated from members that have a good thermal conductivity; furthermore, since the pressing members that actually press the quartz crystal substrate are formed as members that are separated from the heater blocks, and that can maintain hardness at high temperatures, the problem of deformation of the pressing surfaces due to high temperatures can be alleviated.

Furthermore, by using a material that allows high-flatness surface working as the material of the pressing members, it is possible to work the pressing surfaces with an error that is small compared to the surface steps that are formed on the quartz crystal substrate, so that the quartz crystal substrate can be uniformly pressed.

For example, super-hard metals, sapphire, ceramics, and the like may be cited as materials that are suitable for constructing the pressing members. Examples of super-hard metals include tungsten carbide (abbreviated to "WC") type metals. The quenching temperature of such metals is sufficiently higher than 600° C., so that the Young's modulus of such metals is sufficiently greater than that of quartz crystal at a high temperature of 600 degrees. Furthermore, the surface precision can easily be kept to within 1 µm by polishing, so that a surface flatness value that is sufficiently finer than the depth of the steps formed by the dry etching of the quartz crystal can be obtained.

Moreover, sapphire ($Al_2O_3$) also has a large Young's modulus at high temperatures, and also has the special feature of allowing easy polishing to a surface precision of $\lambda/10$ ($\lambda=628$ nm) or finer. Furthermore, unlike conventionally used SUS304, sapphire shows no oxidation at high temperatures; accordingly, sapphire is also extremely advantageous in terms of durability. Ceramic materials are also suitable as the material of the pressing plates. For example, such materials include silicon nitride ($Si_3N_4$) and the like.

The fourth invention that is used to achieve the object described above is the third invention, which is characterized in that the portions of the surface of one of the pressing members that contact the portions of the quartz crystal that desirably undergo twinning is worked so that these portions have a protruding shape that protrudes beyond the other portions.

In this invention, since protruding parts are disposed on the side of the pressing member, it is necessary merely to polish the surface of the quartz crystal substrate; even if a step structure is not formed, the portions of the quartz crystal substrate that contact the protruding parts of the pressing member and are pressed by these protruding parts will undergo twinning, so that a twin is formed. Accordingly, there is no need for a process in which a step structure is formed by photolithography and wet etching for each quartz crystal substrate as in conventional methods.

The fifth invention that is used to achieve the object described above is a pressing apparatus used to form a twin in a quartz crystal by the hot pressing method, this pressing apparatus being characterized in that the apparatus has a heating mechanism in the pressing blocks, and this heating mechanism has a plurality of heaters.

In this invention, a heating mechanism is disposed in the pressing blocks (of the pressing apparatus) that actually press the quartz crystal substrate, and this heating mechanism has a plurality of heaters. Accordingly, unlike conventional cases in which heating is performed using a single heater in each pressing block, the pressing surfaces of the pressing blocks can be uniformly heated; as a result, the quartz crystal substrate can be heated to a uniform temperature.

The sixth invention that is used to achieve the object described above is a pressing apparatus used to form a twin in a quartz crystal by the hot pressing method, this pressing apparatus being characterized in that air pressure alone is used to generatethe pressing force.

In this invention, a pressing force is not generated by means of hydraulic pressure using a hydraulic pressure conversion amplifier as in conventional techniques; instead, a pressing force is generated by means of air pressure alone. Accordingly, there is no response lag of a hydraulic pressure conversion amplifier, so that the pressing force can be caused to track command values with rapid response characteristics. Furthermore, even in cases where the pressure generating mechanism such as an air cylinder is replaced in order to alter the range of the pressing force, there is no need to take the trouble of removing the oil or removing the air, etc. (unlike the case of a hydraulic cylinder), so that the work can easily be performed.

BEST MODE FOR CARRYING OUT THE INVENTION

Figure 1:
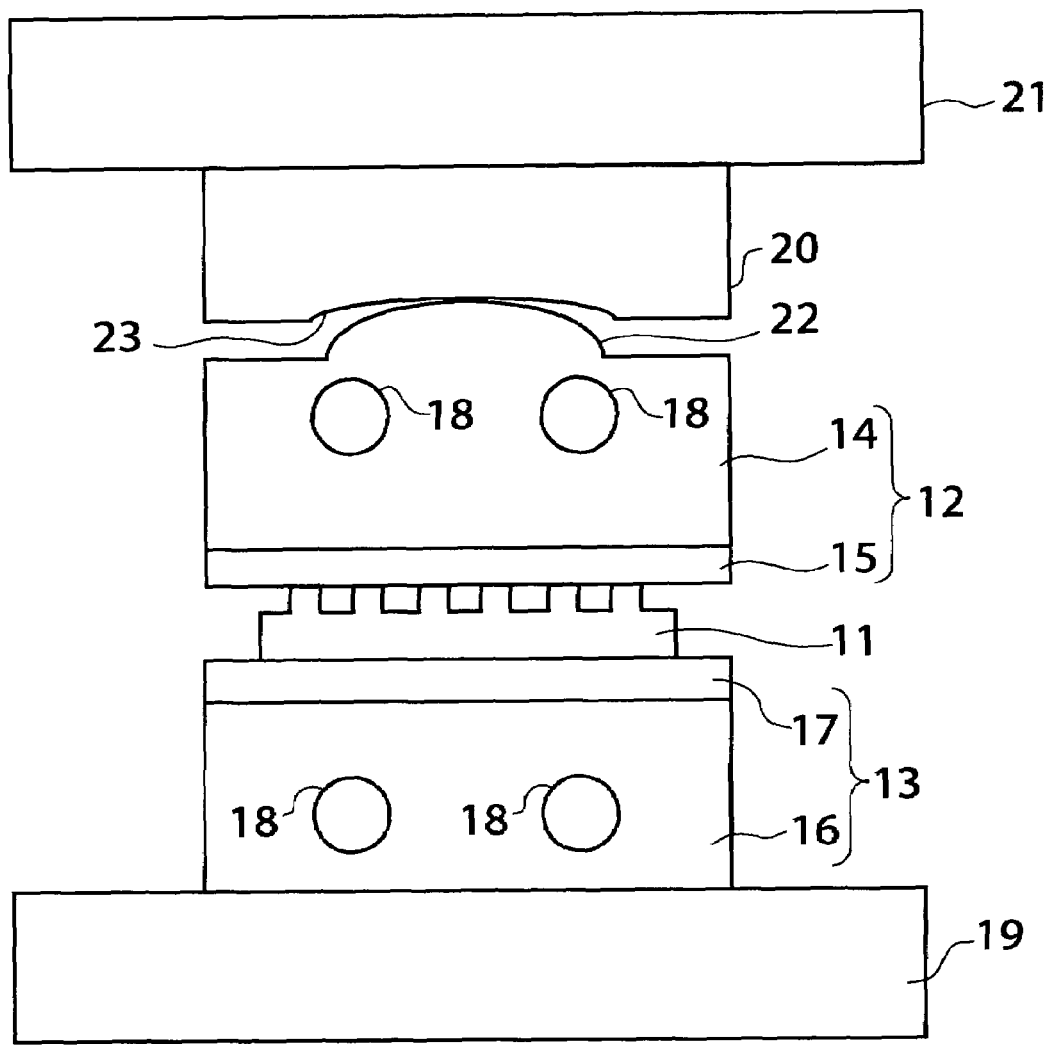
FIG. 1 is a schematic diagram showing a state in which a quartz crystal substrate constituting one working configuration of the present invention is pressed using a pressing apparatus which also constitutes one working configuration of the present invention.

Working configurations of the present invention will be described below with reference to the figures. FIG. 1 is a schematic diagram showing a state in which a quartz crystal substrate constituting one working configuration of the present invention is pressed using a pressing apparatus which also constitutes one working configuration of the present invention. The basic construction of this pressing apparatus is substantially the same as that of the conventional apparatus shown in FIG. 5; accordingly, only the main parts are shown in schematic terms in FIG. 1.

A quartz crystal substrate 11 is heated in a state in which this substrate is clamped between an upper block 12 and a lower block 13, and is pressed so that a stress is applied. The upper block 12 is constructed from an upper heater block 14 and an upper pressing plate 15; the upper heater block 14 and upper pressing plate 15 are connected by screws, a high-temperature adhesive agent, or the method described below. The lower block 13 is constructed from a lower heater block 16 and a lower pressing plate 17; the lower heater block 16 and lower pressing plate 17 are connected by screws, a high-temperature adhesive agent, or the method described below.

The upper heater block 14 and lower heater block 16 are constructed from SUS304, and heaters 18 are embedded in two through-holes formed in each of these blocks. The upper pressing plate 15 and lower pressing plate 17 are constructed from a material that can maintain hardness at high temperatures and that can be sufficiently planarized, such as a super-hard metal, sapphire, a ceramic, quartz glass and quartz crystal. The pressing surfaces of these pressing plates are finished to a surface precision of approximately 60 nm by polishing.

The lower block 13 is coupled to a lower plate 19. The upper block 12 contacts a bearing block 20, and the bearing block 20 is coupled to an upper plate 21. The upper block 12 has a protruding part 22 which is worked into a convex surface with a radius of R1 on its upper surface, and the bearing block 20 has a recessed part 23 which is worked into a concave surface with a radius of R2 (R2>R1) in its undersurface. In this way, a swinging mechanism is constructed; as a result, the pressing surface of the upper pressing plate 15 always conforms to the surface of the quartz crystal substrate 11 during pressing, so that a uniform load is applied to the quartz crystal substrate 11.

This mechanism is universally known as a free shank mechanism. However, besides using this mechanism, it would also be possible to obtain substantially the same operating effect by coupling the upper block 12 and bearing block 20 via a spherical bearing, or attaching the upper block 12 to the upper plate 21 via a gymbal mechanism.

Furthermore, in this working configuration, two heaters 18 which are used to heat the quartz crystal substrate 11 are installed in each of the heater blocks, i.e., the upper and lower heater blocks 14 and 16. These two heaters 18 have the same shape and heating capacity, and are disposed symmetrically on the left and right (in the figure) with respect to the center axes of the respective heater blocks 14 and 16 so that these heaters are located in positions that are equally distant from the pressing surfaces. Coil heaters are used as the heaters 18; however, it would also be possible to employ heaters using other means, e.g., radio frequency heating or heating by means of an electric furnace.

As a result of such a construction, the uniformity of the temperature distribution is favorable in the central portions of the pressing surfaces of the upper block 12 and lower block 13. Furthermore, if the size of the pressing surfaces of the upper block 12 and lower block 13 is made larger than the size of the quartz crystal substrate 11, irregularity in the temperature distribution in the central portions of the pressing surfaces of the upper block 12 and lower block 13 can be further reduced.

Thus, in the working configuration shown in FIG. 1, both pressure and temperature are uniformly applied to the quartz crystal substrate 11, so that variation in the conditions of twin production in the quartz crystal can be reduced in the substrate.

The quartz crystal substrate 11 shown in FIG. 1 is a substrate in which a step structure that has fine protruding parts in a periodic configuration is formed on one side by a photolithographic process and dry etching.

For example, such a quartz crystal substrate 11 can be manufactured by the process described below. First, a Cr film is formed to a thickness of approximately 100 nm on the surface of the quartz crystal substrate by a sputtering process. The surface of this film is coated with a positive type resist, and the portions other than the portions that will form the protruding parts are exposed using a semiconductor exposure apparatus such as an i-line stepper, and are developed. Then, the Cr film is removed using the remaining resist as a mask. Then, dry etching such as RIE or ICP, etc., is performed using the remaining resist film and Cr film as a mask, so that a step structure with a depth of a few microns is manufactured. Finally, a quartz crystal substrate 11 in which a step structure having protruding parts (such as that shown in FIG. 1) is formed on the surface is complete by removing the resist film and Cr film.

However, in cases where a twin is formed in a quartz crystal substrate by such a method, a step structure must be formed by the process described above for each quartz crystal substrate. On the other hand, in the working configuration shown in FIG. 1, it would also be possible (for example) to devise the system so that a step structure which has periodic protruding parts is formed on the surface of the upper pressing plate instead of forming this surface as a flat surface, and a twin is formed in the quartz crystal substrate by heating and pressing the quartz crystal substrate whose surface is polished to a flat surface. As a result, the process of step working for each quartz crystal substrate can be omitted.

Conventionally, the pressing surfaces have been formed from SUS304; accordingly, there has been no working technique for performing fine step working with a period of several microns to several tens of microns. However, if the pressing surfaces are formed from a ceramic, e.g., silicon nitride ($Si_3N_4$), etc., such fine working can be performed by means of the lithographic exposure, Cr film formation and dry etching described above, so that step working can be performed on the pressing surfaces. Furthermore, silicon nitride also has good durability at high temperatures, and can be used repeatedly.

Figure 2:
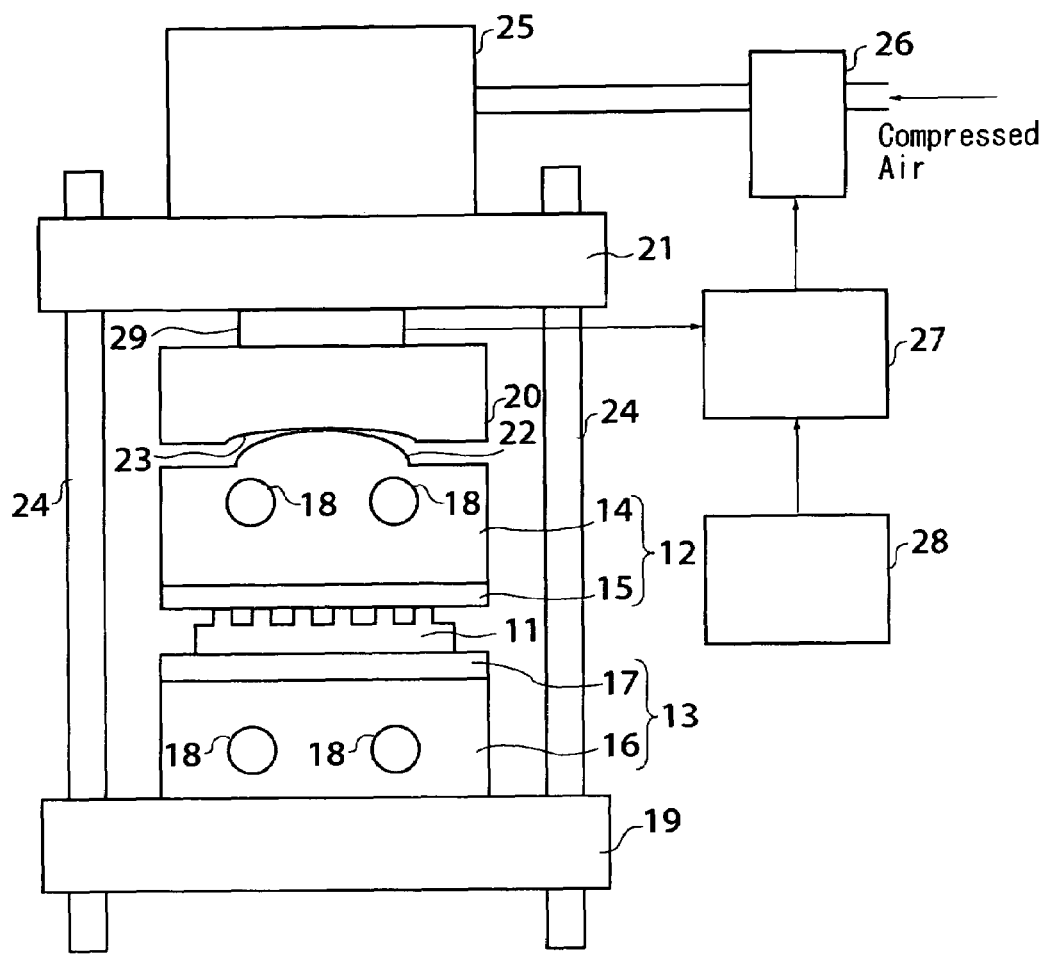
FIG. 2 is a diagram showing an outline of a pressing apparatus constituting another working configuration of the present invention.

FIG. 2 shows an outline of a pressing apparatus constituting another working configuration of the present invention. The main parts of the pressing apparatus shown in FIG. 2 are substantially the same as those of the pressing apparatus shown in FIG. 1; accordingly, the same symbols are assigned to the same components, and a description of such components are omitted.

Figure 5:
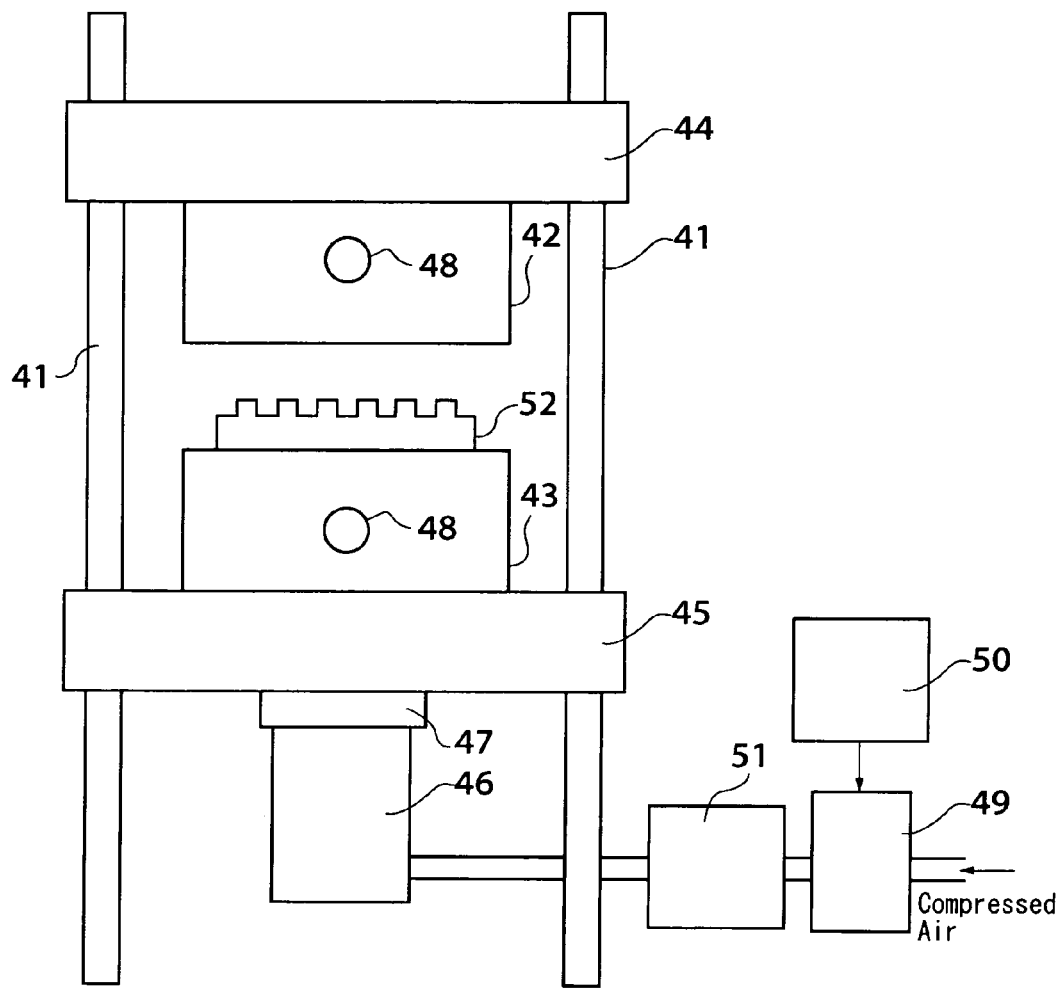
FIG. 5 is a schematic diagram of a conventional pressing apparatus for applying temperature and pressure to a quartz crystal substrate.

In FIG. 2, as is seen from a comparison of FIG. 2 and FIG. 5, a lower plate 19 is fastened to the four supporting columns 24 by means of screws and nuts, and an upper plate 21 is disposed so that this upper plate 21 can slide along the four supporting columns 24. However, this difference is not peculiar to the present invention; in the present invention as well, it would also be possible to devise the system so that the upper plate is fixed and the lower plate is caused to slide as in FIG. 5.

In the working configuration shown in FIG. 2, an air cylinder 25 is installed for the driving and pressing of the upper plate 21, and air at a pressure controlled by an electrical air regulator 26 is fed into the air cylinder 25. The electrical air regulator 26 is controlled by a function generator 28 via an electrical air regulator control device 27. A load gauge 29 is disposed between the upper plate 21 and the bearing block 20, and the output value of this gauge is input into the electrical air regulator 27. The electrical air regulator control device 27 controls the electrical air regulator 26 so that an output of the load gauge 29 that is proportional to the voltage supplied from the function generator 28 is obtained.

In this example, compressed air at a pressure of approximately 0.5 MPa is supplied to the electrical air regulator 26. By supplying a voltage in the range of 0 to 10 V to the electrical air regulator 26, it is possible to vary the air pressure that is supplied to the air pressure cylinder in the range of 0 to 0.5 MPa. If the air pressure cylinder has a diameter of 180 mm, a load of approximately 0 to 12.7 kN can be generated at the air pressure described above. The rise time of the electrical air regulator 26 is 100 ms or less, and the rise time of the load in the air cylinder 25 is a few hundred milliseconds or less. Accordingly, a load can be applied to the quartz crystal substrate with a shorter response time than in cases where a hydraulic pressure conversion amplifier is used.

Furthermore, in this working configuration, an electrical air regulator control device 27 is provided which monitors an electrical signal from the load gauge 29 that is proportional to the load, and which performs a control action so that the load that is instructed by the function generator 28 is applied. Accurate load application can be accomplished by means of this feedback control mechanism.

Figure 3:
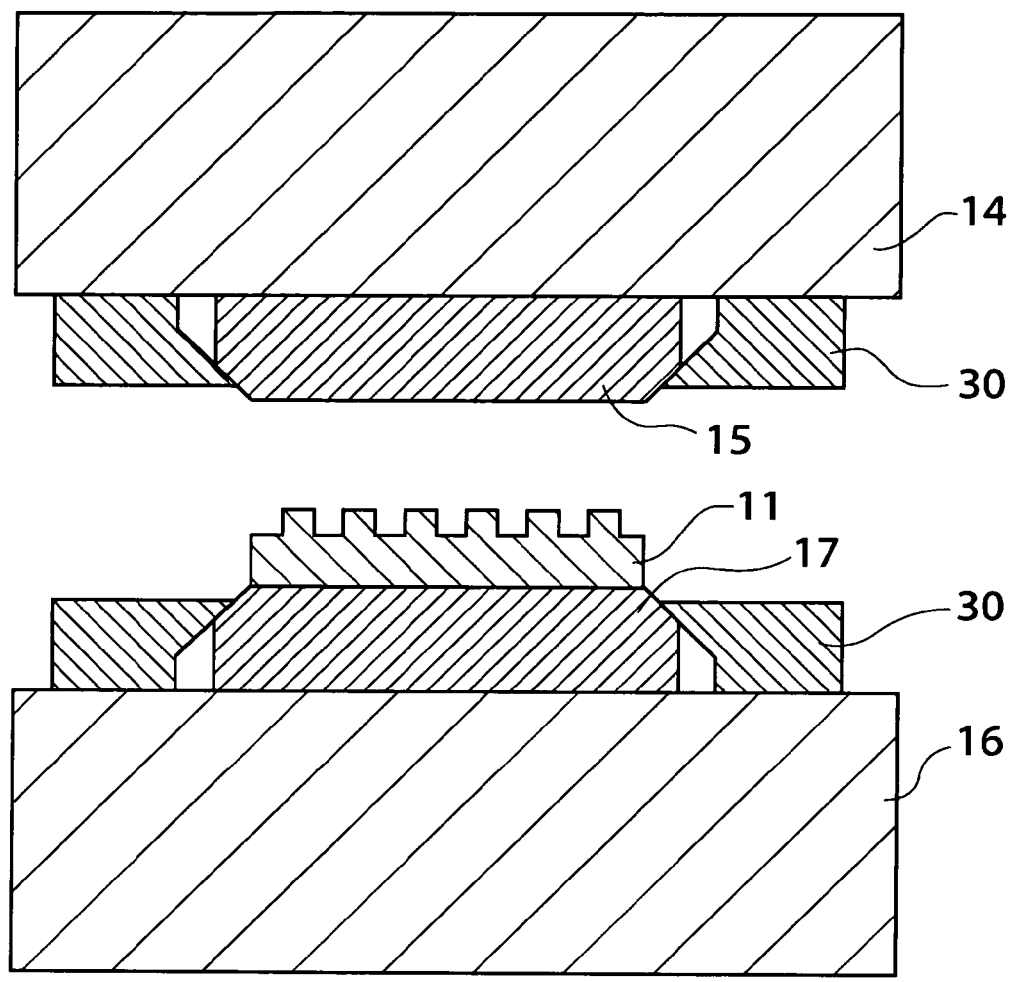
FIG. 3 is a diagram showing an example of the method for fastening the pressing plates to the heater blocks.
Figure 4:
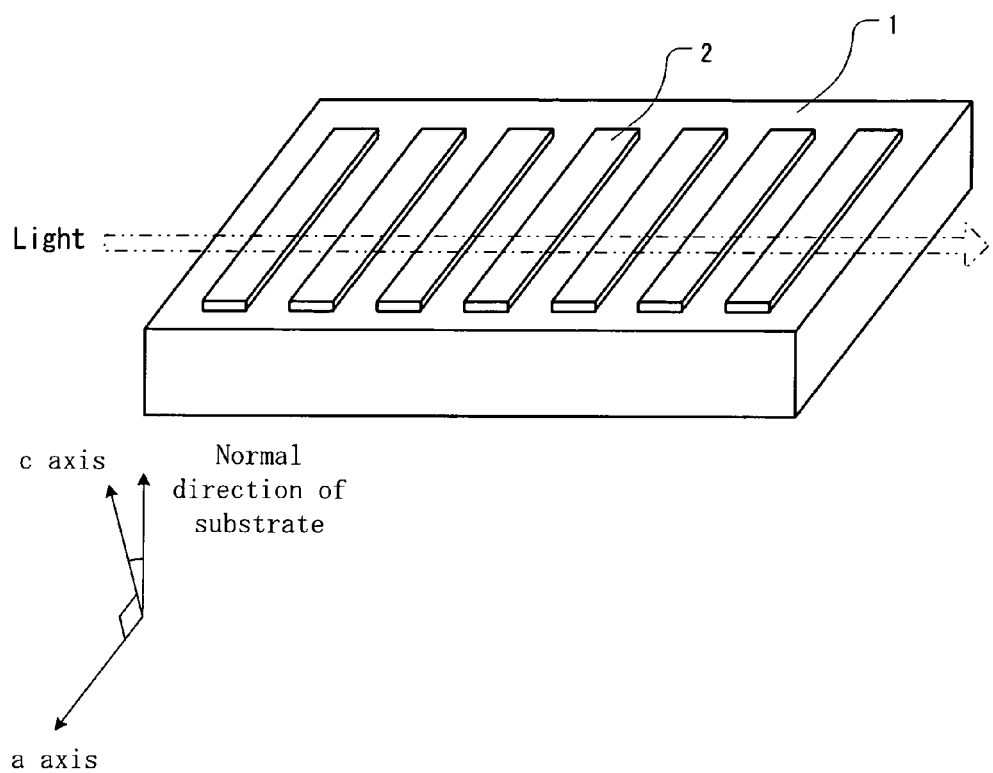
FIG. 4 is a diagram showing an example of a quartz crystal substrate in which a step structure is formed on the surface of one side.

FIG. 3 shows an example of the method for fastening the pressing plates to the heater blocks. As was described above, sapphire or quartz glass, etc., is conceivable as the material of the pressing plates. In the case of such materials, however, the working of countersink holes used for screw fastening is difficult, and even if such working can be accomplished, this entails an extremely high cost and amount of labor. Accordingly, in the working configuration shown in FIG. 3, the pressing plates are fastened to the heater blocks without screw hole working. Specifically, large beveled surfaces are formed on the sides of the upper pressing plate 15 and lower pressing plate 17 that face the quartz crystal substrate 11. Furthermore, pressing plate retainers 30 formed from a material that allows countersink hole working are installed, and these countersink holes are caused to adhere tightly to the beveled parts of the respective pressing plates.

Moreover, the pressing plate retainers 30 are fastened to the upper heater block 14 and lower heater block 16 by screw fastening or the like; in this case, the upper pressing plate 15 and lower pressing plate 17 are respectively fastened to the upper heater block 14 and lower heater block 16 so that the beveled parts of the upper pressing plate 15 and lower pressing plate 17 and the countersink holes in the pressing plate retainers 30 contact each other. By using such a method, it is possible to use pressing plates made of any desired material.

The invention claimed is:

1. A pressing apparatus for forming a twin in a quartz crystal by the hot pressing method, comprising:
   a lower block consisting of a lower heater block and a lower pressing plate;
   an upper block consisting of an upper heater block and an upper pressing plate; and
   a bearing block connecting to the upper heater block of the upper block,
   wherein the lower block and the upper block function to hold the quartz crystal,
   the lower pressing plate and the upper pressing plate are constructed from a different material from the lower heater block and the upper heater block,
   a surface disposed so that it contacts with the quartz crystal during the hot pressing, on either the lower pressing plate or the upper pressing plate; said surface having a step structure with a plurality of periodic protruding parts satisfying quasi-phase matching condition for the quartz crystal and having the period from several microns to several tens of microns,
   the upper heater block has a protruding part which is worked into a convex surface with a radius of R1,
   the bearing block has a recessed part with is worked into a concave surface with a radius of R2 (R2>R1), and
   the protruding part and the recessed part are engaged to generate a swinging mechanism.

2. The pressing apparatus according to claim 1, wherein the upper heater block and the lower heater block comprise a plurality of heaters, respectively.

3. The pressing apparatus according to claim 1 which is characterized in that air pressure alone is used to generate the pressing force.

\* \* \* \* \*